United States Patent
Fujito et al.

(10) Patent No.: US 9,428,386 B2
(45) Date of Patent: Aug. 30, 2016

(54) PROCESS FOR PRODUCING A GROUP-III NITRIDE CRYSTAL AND PROCESS FOR PRODUCING A LIGHT-EMITTING SEMICONDUCTOR ELEMENT OR A SEMICONDUCTOR DEVICE COMPRISING A GROUP-III NITRIDE CRYSTAL

(71) Applicant: MITSUBISHI CHEMICAL CORPORATION, Tokyo (JP)

(72) Inventors: Kenji Fujito, Ushiki (JP); Yasuhiro Uchiyama, Ushiku (JP)

(73) Assignee: MITSUBISHI CHEMICAL CORPORATION, Tokyo (JP)

(*) Notice: Subject to any disclaimer, the term of this patent is extended or adjusted under 35 U.S.C. 154(b) by 229 days.

(21) Appl. No.: 14/229,316

(22) Filed: Mar. 28, 2014

(65) Prior Publication Data

US 2014/0209012 A1 Jul. 31, 2014

Related U.S. Application Data

(63) Continuation of application No. 13/548,829, filed on Jul. 13, 2012, now Pat. No. 8,728,622, which is a continuation of application No. PCT/JP2011/050452, filed on Jan. 13, 2011.

(30) Foreign Application Priority Data

Jan. 15, 2010 (JP) ................................ 2010-007307

(51) Int. Cl.
*C30B 25/18* (2006.01)
*C01B 21/06* (2006.01)
(Continued)

(52) U.S. Cl.
CPC ............. *C01B 21/0632* (2013.01); *C30B 7/10* (2013.01); *C30B 9/12* (2013.01); *C30B 25/18* (2013.01);
(Continued)

(58) Field of Classification Search
CPC ....... C30B 19/00; C30B 19/02; C30B 19/12; C30B 25/00; C30B 25/02; C30B 25/18; C30B 25/186; C30B 25/20; C30B 29/00; C30B 29/38; C30B 29/403; C30B 29/406; C30B 9/00; C30B 9/04; C30B 9/12; C30B 7/00; C30B 7/005; C30B 7/10; C30B 7/105; C23C 16/00; C23C 16/22; C23C 16/30; C23C 16/301; C23C 16/303
USPC .......... 117/73, 78, 84, 88, 94, 97, 101, 106, 117/902, 937, 952
See application file for complete search history.

(56) References Cited

U.S. PATENT DOCUMENTS 6,413,627 B1 7/2002 Motoki et al.
6,829,270 B2 12/2004 Suzuki et al.
(Continued)

FOREIGN PATENT DOCUMENTS

JP 2000-022212 1/2000
JP 2003-063897 3/2003
(Continued)

OTHER PUBLICATIONS

International Search Report issued Mar. 29, 2011 in PCT/JP2011/050452 filed Jan. 13, 2011.
(Continued)

*Primary Examiner* — Kenneth A Bratland, Jr.
(74) *Attorney, Agent, or Firm* — Oblon, McClelland, Maier & Neustadt, L.L.P.

(57) ABSTRACT

Provided is a base substrate with which a Group-III nitride crystal having a large area and a large thickness can be grown while inhibiting crack generation. A single-crystal substrate for use in growing a Group-III nitride crystal thereon, which satisfies the following Z1>0 expression (1), wherein Z1 (μm) is an amount of warpage of physical shape in a growth surface of the single-crystal substrate and Z2<0 expression (2), wherein Z2 (μm) is an amount of warpage calculated from a radius of curvature of crystallographic-plane shape in a growth surface of the single-crystal substrate.

18 Claims, 3 Drawing Sheets

(a)

(b)

(c)

(d)

(51) Int. Cl.
  *C30B 29/40* (2006.01)
  *H01L 21/02* (2006.01)
  *C30B 7/10* (2006.01)
  *C30B 9/12* (2006.01)

(52) U.S. Cl.
  CPC ........... *C30B 29/403* (2013.01); *C30B 29/406* (2013.01); *H01L 21/0237* (2013.01); *H01L 21/0243* (2013.01); *H01L 21/0254* (2013.01); *H01L 21/0262* (2013.01); *H01L 21/02389* (2013.01); *H01L 21/02433* (2013.01); *Y10T 428/24628* (2015.01); *Y10T 428/31* (2015.01)

(56) References Cited

U.S. PATENT DOCUMENTS

| | | |
|---|---|---|
| 7,275,031 B2 | 9/2007 | Hoerich et al. |
| 7,276,779 B2 | 10/2007 | Shibata |
| 7,932,114 B2 | 4/2011 | Nakanishi et al. |
| 2005/0142391 A1 | 6/2005 | Dmitriev et al. |
| 2006/0169197 A1 | 8/2006 | Sasaki et al. |
| 2007/0176199 A1* | 8/2007 | Shibata ................... C30B 25/02 257/103 |
| 2007/0261633 A1 | 11/2007 | Tanaka |
| 2009/0092815 A1 | 4/2009 | Dmitriev et al. |
| 2009/0127564 A1 | 5/2009 | Irikura et al. |

FOREIGN PATENT DOCUMENTS

| | | |
|---|---|---|
| JP | 2005-340747 | 12/2005 |
| JP | 2007-197276 | 8/2007 |
| JP | 2007-217216 | 8/2007 |
| JP | 2008-124151 | 5/2008 |
| JP | 2009-023861 | 2/2009 |
| JP | 2009-023862 | 2/2009 |
| JP | 2009-102217 | 5/2009 |
| JP | 2009-126727 | 6/2009 |
| JP | 2009-161436 | 7/2009 |
| JP | 2009-167057 | 7/2009 |

OTHER PUBLICATIONS

Aug. 20, 2013 Japanese Office Action with partial English language translation, for JP 2013-111820.

European Search Report, issued on Jan. 8, 2014, 5pp, for EP 11 732 931.8.

* cited by examiner (a)

(b)

(c)

(d)

(e)

(a)

(b)

(c)

(d)

PROCESS FOR PRODUCING A GROUP-III NITRIDE CRYSTAL AND PROCESS FOR PRODUCING A LIGHT-EMITTING SEMICONDUCTOR ELEMENT OR A SEMICONDUCTOR DEVICE COMPRISING A GROUP-III NITRIDE CRYSTAL

This application is a continuation application of U.S. Ser. No. 13/548,829 filed on Jul. 13, 2012 which is a continuation application of PCT/JP11/50452 filed on Jan. 13, 2011.

TECHNICAL FIELD

The present invention relates to a single-crystal substrate for use in growing a Group-III nitride crystal thereon and to a Group-III nitride crystal obtained using the single-crystal substrates and a process for producing the Group-III nitride crystal.

BACKGROUND ART

Group-III element nitride semiconductors have a high melting point and have a high nitrogen dissociation pressure at around the melting point. Consequently, bulk growth from the melt is difficult. Meanwhile, it is known that a Group-III element nitride semiconductor substrate can be produced by using vapor phase growth methods such as a hydride vapor phase epitaxy (HVPE) method and a metal-organic chemical vapor deposition (MOCVD) method.

For example, in the case of producing a gallium nitride semiconductor substrate, a base substrate such as, for example, sapphire is set in the growth chamber (reactor) of a vapor phase growth apparatus. Gases for Group-III element nitride semiconductor formation which include, for example, a gas containing a gallium compound and a gas containing a nitrogen compound are fed to the inside of the reactor to thereby grow a gallium nitride semiconductor to a thickness of several micrometers to several centimeters on the base substrate. Thereafter, a portion including the base substrate is removed by polishing or laser light irradiation. Thus, a desired Group-III element nitride semiconductor substrate can be obtained.

Of those vapor phase growth methods, the HVPE method has the feature of being capable of attaining a higher growth rate than other growth methods. The HVPE method hence is effective when it is necessary to grow a Group-III element nitride semiconductor in a large thickness, or is effective as a technique for obtaining a Group-III element nitride semiconductor substrate having a sufficient thickness.

Hitherto, one single-crystal gallium nitride substrate has been obtained by growing single-crystal gallium nitride having a thickness of about 500 μm to 1 mm on one base substrate made of a different kind of material, removing the base substrate, and subjecting the remaining portion to processing/polishing. This method, however, is exceedingly low in production efficiency and cannot be used to provide an inexpensive single-crystal gallium nitride substrate.

Attention is hence being focused on a technique in which a single crystal having a thickness of several millimeters to several centimeters is grown on a base substrate and this single-crystal bulk is sliced to thereby obtain a plurality of single-crystal gallium nitride substrates using the one base substrate.

In such a case, however, a problem arises when a film is grown to a thickness of several tens of micrometers to several hundred micrometers or more. When a film is grown to a thickness of several tens of micrometers to several hundred micrometers or more, cracks generate in the crystal during the growth. Consequently, a crystal having a large area is not obtained.

A technique has been proposed in which the shape of the base substrate is regulated in order to inhibit such crystal cracking. Specifically, patent document 1 describes a single-crystal substrate in which the main surface is a convex surface and has been mirror-polished, as a single-crystal substrate on which a film of a nitride semiconductor crystal of higher quality can be formed.

Patent document 2 describes that a base substrate which has a convex surface shape and has an amount of warpage of 20-100 μm is used in order to obtain a nitride semiconductor substrate reduced in in-plane off-angle unevenness.

Furthermore, in patent document 3, a Group-III element nitride semiconductor crystal substrate in which atoms of the Group-III element constitute a convex surface and which has a specific warpage ratio is described for the purpose of providing a Group-III element nitride semiconductor device having reduced unevenness of luminescence intensity.

Another technique for inhibiting such crystal cracking has been proposed, in which the amount of warpage of the crystallographic-plane shape (and crystal axis) of a base substrate is regulated. Specifically, patent document 4 proposes a technique in which the warpage of the growth surface of a base substrate is regulated so as to have a radius of curvature of 2 m or more to thereby inhibit cracking.

PRIOR-ART DOCUMENTS

Patent Documents

Patent Document 1: JP-A-2008-124151
Patent Document 2: JP-A-2009-167057
Patent Document 3: JP-A-2009-161436
Patent Document 4: JP-A-2009-23861

SUMMARY OF THE INVENTION

Problems that the Invention is to Solve

However, patent documents 1, 2, and 3 specify the warpage of a physical shape only, while patent document 4 specifies the warpage of a crystallographic-plane shape only by showing the warpage of the growth surface. Consequently, these techniques are insufficient in the effect of inhibiting the cracking of crystals grown on those substrates. Especially when a crystal having a large area is to be obtained or when a crystal having a large film thickness is to be obtained, there is a problem that considerable cracking occurs.

The present inventors provide a single-crystal substrate with which such problems of prior-art techniques are overcome and a Group-III nitride crystal having a large area and a large film thickness can be obtained while inhibiting the crystalline nitride from cracking. The inventors further provide a crack-free Group-III nitride crystal obtained using the single-crystal substrate, and furthermore provide a process for producing the crystalline nitride.

Means for Solving the Problems

The present inventors diligently made investigations in order to accomplish the objects. As a result, the inventors directed attention to both the amount of warpage of the physical shape of a growth surface and the amount of warpage of the crystallographic-plane shape thereof, and have found out single-crystal substrates on which a Group-III nitride crystal that has a large area and a large film thickness and that is inhibited from having cracks can be grown. The invention has been thus achieved.

Namely, essential points of the invention are as follows.
1. A single-crystal substrate for use in growing a Group-III nitride crystal thereon, which satisfies the following expression (1), wherein Z1 (μm) is an amount of warpage of physical shape in a growth surface of the single-crystal substrate and Z2 (μm) is an amount of warpage calculated from a radius of curvature of crystallographic-plane shape in a growth surface of the single-crystal substrate:

$-40<Z2/Z1<-1$    Expression (1).

2. The single-crystal substrate according to the item 1 above, wherein the growth surface of the single-crystal substrate comprises a Group-III nitride crystal.
3. The single-crystal substrate according to the item 1 or 2 above, which has an area of 20 cm² or more.
4. The single-crystal substrate according to any one of the items 1 to 3 above, which has a value of the Z1 of −50 μm to 50 μm.
5. The single-crystal substrate according to any one of the items 1 to 4 above, wherein the single-crystal substrate is a hexagonal crystal, and a crystallographic plane of the growth surface thereof is any one of a {0001} plane, a {10-10} plane, a {11-20} plane, a {11-22} plane, and a {20-21} plane.
6. The single-crystal substrate according to any one of the items 1 to 5 above, which has a absolute value of the Z2 of 0 μm to 312 μm.
7. A single-crystal substrate for use in growing a Group-III nitride crystal thereon, which satisfies the following expressions (2) and (3), wherein Z1 (μm) is an amount of warpage of physical shape in a growth surface of the single-crystal substrate and Z2 (μm) is an amount of warpage calculated from a radius of curvature of crystallographic-plane shape in a growth surface of the single crystal:

$Z1>0$    Expression (2)

$Z2<0$    Expression (3).

8. A Group-III nitride crystal obtainable by growing a Group-III nitride crystal on the single-crystal substrate according to any one of the items 1 to 7 above and removing the single-crystal substrate.
9. A process for producing a Group-III nitride crystal, the process comprising preparing the single-crystal substrate according to any one of the items 1 to 7 above and growing a Group-III nitride crystal on the single-crystal substrate.
10. The process for producing a Group-III nitride crystal according to the item 9 above, wherein the Group-III nitride crystal is grown by a method which is any one of an HVPE method, a sodium flux method, and a solvothermal method.

Effects of the Invention

The single-crystal substrates of the invention have a specific relationship between the amount of warpage of the physical shape of the growth surface and the amount of warpage of the crystallographic-plane shape thereof. Because of this, cracking can be inhibited from occurring during crystal growth on the single-crystal substrates.

Furthermore, by selecting the single-crystal substrates of the invention, whether a Group-III nitride crystal obtained using the single-crystal substrates has a crack or not can be determined in the stage of substrate inspection conducted before the step of growing the Group-III nitride crystal into a thick film. As a result, a Group-III nitride crystal having a large thickness and a large area can be stably produced, and an improvement in productivity can be expected.

In addition, in the case where the single-crystal substrates of the invention are used for producing a light-emitting semiconductor element or a semiconductor device, it is possible to obtain a high-quality light-emitting semiconductor element or semiconductor device in satisfactory yield.

BRIEF DESCRIPTION OF THE DRAWINGS

In FIG. 2, R denotes the radius of curvature, X denotes the diameter of the single-crystal substrate, and ΔZ denotes the amount of warpage, and the R, X, and ΔZ satisfy the following equations: $R^2=(X/2)^2+(R-\Delta Z)^2$; $R=\frac{1}{2}\times\{(X/2)^2/\Delta Z\}+\Delta Z\}$; $\Delta Z^2-2R\Delta Z+(X/2)^2=0$; and $\Delta Z=-R\pm\sqrt{R^2-(X/2)^2}$.

In FIG. 3 (a), the physical shape is convex and the crystallographic-plane shape is convex. In FIG. 3 (b), the physical shape is convex and the crystallographic-plane shape is concave. In FIG. 3 (c), the physical shape is concave and the crystallographic-plane shape is convex. In FIG. 3 (d), the physical shape is concave and the crystallographic-plane shape is concave.

MODES FOR CARRYING OUT THE INVENTION

The single-crystal substrates of the invention and the process for producing a Group-III nitride crystal using the substrates are explained below in detail. The following explanations on constituent elements are sometimes based on representative embodiments of the invention, but the invention should not be construed as being limited to such embodiments. Incidentally, in this description, each numerical range shown with "-" means the range which includes the values given before and after the "-", as a lower limit and an upper limit, respectively.

One of the single-crystal substrates of the invention is a single-crystal substrate for use in growing a Group-III nitride crystal thereon, and is characterized by satisfying the following expression (1), wherein Z1 (μm) is the amount of warpage of the physical shape of the growth surface of the single-crystal substrate and Z2 (μm) is the amount of warpage calculated from the radius of curvature of the crystallographic-plane shape of the growth surface of the single-crystal substrate.

$-40<Z2/Z1<-1$    Expression (1)

The other single-crystal substrate of the invention is a single-crystal substrate for use in growing a Group-III nitride crystal thereon, and is characterized by satisfying the following expressions (2) and (3), wherein Z1 (μm) is the amount of warpage of the physical shape of the growth surface of the single-crystal substrate and Z2 (μm) is the amount of warpage calculated from the radius of curvature of the crystallographic-plane shape of the growth surface of the single-crystal substrate.

$$Z1>0 \qquad \text{Expression (2)}$$

$$Z2<0 \qquad \text{Expression (3)}$$

In this description, the term "growth surface of a single-crystal substrate" means that surface of a single-crystal substrate on which a Group-III nitride crystal is to be grown, and the surface thereof which is on the opposite side from the growth surface is called the back surface.

In the following, the cases where a Group-III nitride crystal having a large thickness is grown on single-crystal substrates of the invention are explained as examples. However, applications of the single-crystal substrates of the invention should not be construed as being limited to such cases. For example, in the case where a Group-III nitride crystal is grown on a single-crystal substrate of the invention to form a device structure and thereby produce a light-emitting semiconductor element or semiconductor device, cracking is inhibited and a flat and even Group-III nitride crystal can be obtained in this case also. Use of the single-crystal substrates of the invention in such applications hence is preferred.

(Physical Shape and Crystallographic-Plane Shape of the Single-Crystal Substrates)

Figure 3:
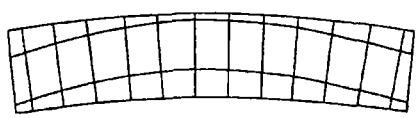
FIG. 3 (a) to (d) are diagrammatic views of four kinds of single-crystal substrates which differ in the amount of warpage of the physical shape and the amount of warpage of the crystallographic-plane shape.
Figure 3:
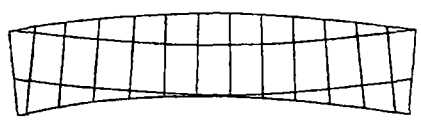
Figure 3:
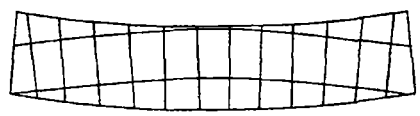
Figure 3:
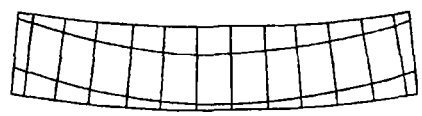

The single-crystal substrates of the invention each may be a single-crystal substrate in which the growth surface has a convex physical shape and has a crystallographic-plane shape that is a warped concave shape (for example, FIG. 3(*b*)) or in which the growth surface has a concave physical shape and has a crystallographic-plane shape that is a warped convex shape (for example, FIG. 3(*c*)).

Specifically, the first aspect is characterized in that the single-crystal substrate satisfies the following expression (1), wherein Z1 (µm) is the amount of warpage of the physical shape of the growth surface of the single-crystal substrate and Z2 (µm) is the amount of warpage calculated from the radius of curvature of the crystallographic-plane shape of the growth surface of the single-crystal substrate.

$$-40<Z2/Z1<-1 \qquad \text{Expression (1)}$$

In this description, the term "the amount of warpage of a physical shape (Z1)" means a value obtained by examining the recess(es) and protrusion(s) of the whole surface of the single-crystal substrate using an optical inspection apparatus and determining the difference between the maximum value and the minimum value thereof. As the optical inspection apparatus, use can be made, for example, of NIDEK Flatness Tester FT-17 (manufactured by NIDEK Co., Ltd.) or the like. Here, the amount of warpage of the physical shape (Z1) of the growth surface of a single-crystal substrate is expressed by a positive number when the growth surface has a convex shape, and is expressed by a negative number when the growth surface has a concave shape.

In this description, the term "the amount of warpage of a crystallographic-plane shape (Z2)" means a value determined through conversion from the radius of curvature of the crystallographic-plane shape. Here, the radius of curvature of the crystallographic-plane shape has the same value as the radius of curvature of a crystal axis.

The radius of curvature of a crystal axis is determined by subjecting sites located at distances of ±8 mm from the center of the single-crystal substrate to analysis by X-ray diffractometry to determine diffraction peak values for the (0002) plane and calculating the radius of curvature from the amount by which the diffraction peak values have shifted. The amount of warpage of a crystallographic-plane shape (Z2) is determined by the following procedure.

(i) The amount by which diffraction peaks for sites located at distances of ±8 mm from the center of the single-crystal substrate have shifted is determined by X-ray diffractometry, and the radius of curvature of the single-crystal substrate is determined from the shift amount. The examination for determining diffraction peak values is made with respect to sites located at distances of ±8 mm from the center of the single-crystal substrate along each of the a-axis direction and the m-axis direction, and the radius of curvature herein is an average of the radius of curvature of the a-axis and the radius of curvature of the m-axis.

Figure 2:
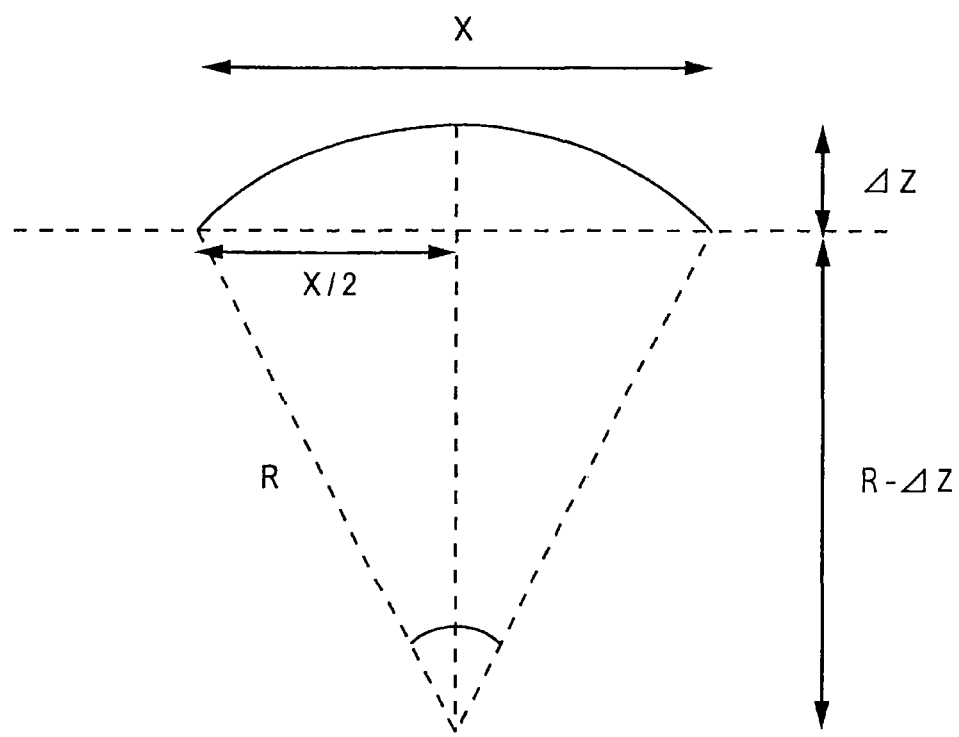
FIG. 2 is a diagrammatic view which shows a relationship between the radius of curvature and the amount of warpage of a crystallographic-plane shape.

(ii) From the radius of curvature thus determined and from the relationship between the radius of curvature (R) and the amount of warpage (ΔZ) shown in FIG. 2, the value of ΔZ for the case where the examined area has been extended to the diameter (X) of the single-crystal substrate, i.e., the amount of warpage of the crystallographic-plane shape (Z2), is determined. In a single-crystal substrate, the radius of curvature differs from region to region within the surface. However, a diameter of ±8 mm from the center is taken as an effective diameter, and the radius of curvature for this effective diameter is assumed to be evenly distributed throughout the surface.

Here, the amount of warpage of the crystallographic-plane shape (Z2) is expressed by a positive number when crystal axes of the single-crystal substrate have been arranged so as to form a convex surface with respect to the direction of the growth surface, and is expressed by a negative number when crystal axes of the single-crystal substrate have been arranged so as to form a concave surface with respect to the direction of the growth surface.

By regulating the values of Z1 and Z2 so as to satisfy the relationship represented by expression (1), cracks can be inhibited from generating during crystal growth on the single-crystal substrate of the invention. Examples of this single-crystal substrate of the invention include the embodiments shown in FIGS. 3(*b*) and (*c*). The reasons why these single-crystal substrates produce the effects of the invention are thought to be as follows.

When a crystal is to be grown on a single-crystal substrate, it is preferred that the single-crystal substrate should have a minimal amount of internal strain therein. The amount of the strain is related to the amount of warpage of the physical shape of the growth surface and to the amount of warpage of the crystallographic-plane shape thereof.

For example, in the case where the physical shape is a warped convex surface, a larger amount of compressive stress is present in the back surface of the substrate than in the growth surface or a larger amount of tensile stress is present in the growth surface of the substrate than in the back surface. Likewise, in the case where the crystallographic-plane shape is a warped concave shape, a larger amount of compressive stress is present in the growth surface of the substrate than in the back surface or a larger amount of tensile stress is present in the back surface of the substrate than in the growth surface.

Namely, in the case of a single-crystal substrate in which the growth surface has a convex physical shape and has a crystallographic-plane shape that is a warped concave shape or in the case of a single-crystal substrate in which the growth surface has a concave physical shape and has a crystallographic-plane shape that is a warped convex shape, it is thought that the amount of the strain due to the physical shape and the amount of the strain due to the crystallographic-plane shape are offset by each other and, as a result, the strain present in the single-crystal substrate can be reduced. Consequently, when a crystal is grown on a single-crystal substrate which has a small amount of internal strain so as to satisfy expression (1), crack generation can be inhibited.

The right side of expression (1), i.e., $Z2/Z1<-1$, is an expression which shows, as a boundary value, the value for a base substrate in which the growth surface has a crystallographic-plane shape which is warped in the same amount as the physical shape of the surface and in the direction reverse to the direction of warpage of the physical shape. Namely, it is presumed that when crystallographic warpage is present in the surface in the same amount as the physical warpage and in the direction reverse to the direction of the physical warpage, then the internal strains present in the single-crystal substrate are offset. In expression (1), it is preferred that $Z2/Z1<-1.5$, and it is more preferred that $Z2/Z1<-2$.

The value of the amount of warpage of the physical shape (Z1) is preferably −50 μm or more, more preferably −40 μm or more, even more preferably −30 μm or more. The value thereof is preferably 50 μm or less, more preferably 40 μm or less, even more preferably 30 μm or less.

The value of the amount of warpage of the crystallographic-plane shape (Z2), in terms of absolute value thereof, is preferably 0 μm or more, more preferably 31 μm or more, even more preferably 50 μm or more. The value thereof is preferably 312 μm or less, more preferably 200 μm or less, even more preferably 150 μm or less.

The second aspect of the single-crystal substrates of the invention specifically is characterized in that the single-crystal substrate satisfies the following expressions (2) and (3), wherein Z1 (μm) is the amount of warpage of the physical shape of the growth surface of the single-crystal substrate and Z2 (μm) is the amount of warpage calculated from the radius of curvature of the crystallographic-plane shape of the growth surface of the single-crystal substrate. Incidentally, Z1 and Z2 have the same meanings as described above.

$$Z1>0 \quad \text{Expression (2)}$$

$$Z2<0 \quad \text{Expression (3)}$$

Specifically, the second aspect is the case in which the growth surface has a convex physical shape and a concave crystallographic-plane shape, and examples thereof include the embodiment shown in FIG. 3 (b). In such a case, the physical warpage and the crystallographic warpage are present in the surface in opposite directions, and the strains present in this single-crystal substrate are presumed to be offset.

The reasons for this are thought to be the same as in the case of the first aspect described above. Consequently, a Group-III nitride crystal obtained using this single-crystal substrate has no cracks. It is hence possible to obtain a Group-III nitride crystal having a large area and a large thickness.

From the standpoints of an actual limit on processing accuracy and of the preference of a flat physical shape, Z1 is preferably 100 μm or less, more preferably 50 μm or less.

Meanwhile, Z2 is preferably −31 μm (radius of curvature, 10 m) or less, more preferably −50 μm or less. From the standpoints of an actual limit on processing accuracy and of the preference of a flat crystallographic-plane shape, Z2 is preferably −312 μm (radius of curvature, 1 m) or more, more preferably −156 μm (radius of curvature, 2 m) or more.

The shapes of those single-crystal substrates of the invention are not particularly limited, and can be deteriorated in accordance with the shape of a Group-III nitride crystal to be obtained. Usually, circular, elliptic, and rectangular shapes are preferred. More preferred of these are circular shapes.

The sizes of the single-crystal substrates of the invention also can be determined in accordance with the size of a Group-III nitride crystal to be obtained. The diameter of the growth surface which is circular or the major-axis length of the growth surface which is rectangular is usually preferably 10-300 mm, more preferably 20-150 mm, even more preferably 50-100 mm.

With respect to the sizes of the single-crystal substrates, the substrates may have an area of preferably 20 $cm^2$ or more, more preferably 46 $cm^2$ or more, even more preferably 81 $cm^2$ or more.

The thicknesses of the single-crystal substrates are preferably 100-1,000 μm, more preferably 300-500 μm.

(Kind of the Single-Crystal Substrates)

The single-crystal substrates of the invention are not particularly limited in the kind thereof so long as the substrates have a growth surface on which a Group-III nitride crystal can be grown. It is, however, preferred that the substrates each should be a hexagonal crystal because a Group-III nitride crystal having satisfactory crystallinity is obtained therewith. More preferred is a hexagonal crystal having lattice constants which are close to those of the Group-III nitride crystal to be grown. Examples thereof include sapphire, zinc oxide crystals, and nitride crystals.

It is preferred that the single-crystal substrates each should be a nitride crystal among these. More preferred is a nitride crystal of the same kind as the Group-III nitride crystal to be grown on the growth surface. Examples thereof include gallium nitride. It is especially preferred that the growth surface of each single-crystal substrate should include a crystal of a Group-III element nitride.

Sapphire has lattice constants of 4.758 Å for the a-axis and 12.983 Å for the c-axis. Gallium nitride has lattice constants of 3.189 Å for the a-axis and 5.185 Å for the c-axis.

The plane orientation of the single-crystal substrates is not particularly limited so long as the growth surface can enable a Group-III nitride crystal to grow thereon. For example, a {0001} plane, a {10-10} plane, a {11-20} plane, a {11-22} plane, a {20-21} plane, and the like are preferred. More preferred of these is a (0001) plane.

In this description, the term "C plane" means the (0001) plane of a hexagonal structure (wurtzite crystal structure). In Group-III element nitride crystals, "C plane" is a Group-III element plane. In gallium nitride, "C plane" corresponds to a Ga plane.

In this description, the term "C plane" means the growth surface of a single-crystal substrate which has a growth surface that lies within the range of directions deflected from the C-axis by up to 25°, which are measured with an accuracy within ±0.01°. It is preferred that the "C plane" should be the growth surface which lies within the range of directions deflected by up to 10°. It is more preferred that the "C plane" should be the growth surface which lies within the range of directions deflected by up to 5°.

In this description, the term "{10-10} plane" means "M plane", and this plane is equivalent to the {1-100} plane of a hexagonal structure (wurtzite crystal structure). The plane equivalent to the {1-100} plane is a nonpolar plane and usually is a cleavage plane.

The plane equivalent to the {1-100} plane is any of a (1-100) plane, (–1100) plane, (01-10) plane, (0-110) plane, (10-10) plane, and (–1010) plane.

In this description, the term "M plane" means the growth surface of a single-crystal substrate which has a growth surface that lies within the range of directions deflected from the M-axis toward the A-axis by up to 15°, which are measured with an accuracy within ±0.01°. It is preferred that the "M plane" should be the growth surface which lies within the range of directions deflected by up to 10°. It is more preferred that the "M plane" should be the growth surface which lies within the range of directions deflected by up to 5°.

Furthermore, the term "M plane" means the growth surface of a single-crystal substrate which has a growth surface that lies within the range of directions deflected from the M-axis toward the C-axis by up to 25°, which are measured with an accuracy within ±0.01°. It is preferred that the "M plane" should be the growth surface which lies within the range of directions deflected by up to 10°. It is more preferred that the "M plane" should be the growth surface which lies within the range of directions deflected by up to 5°.

In this description, the term "{11-20} plane" means "A plane", and this plane is equivalent to the {11-20} plane of a hexagonal structure (wurtzite crystal structure). The plane equivalent to the {11-20} plane is a nonpolar plane.

Examples of the plane equivalent to the {11-20} plane are a (11-20) plane, (–1-120) plane, (1-210) plane, (–12-10) plane, (–2110) plane, and (2-1-10) plane.

In this description, the term "A plane" means the growth surface of a single-crystal substrate which has a growth surface that lies within the range of directions deflected from the A-axis toward the M-axis by up to 15°, which are measured with an accuracy within ±0.01°. It is preferred that the "A plane" should be the growth surface which lies within the range of directions deflected by up to 10°. It is more preferred that the "A plane" should be the growth surface which lies within the range of directions deflected by up to 5°.

Furthermore, the term "A plane" means the growth surface of a single-crystal substrate which has a growth surface that lies within the range of directions deflected from the A-axis toward the C-axis by up to 25°, which are measured with an accuracy within ±0.01°. It is preferred that the "A plane" should be the growth surface which lies within the range of directions deflected by up to 10°. It is more preferred that the "A plane" should be the growth surface which lies within the range of directions deflected by up to 5°.

In this description, the term "{11-22} plane" means a plane which is equivalent to the {11-22} plane of a hexagonal structure (wurtzite crystal structure). The plane equivalent to the {11-22} plane is a semipolar plane.

The plane equivalent to the {11-22} plane is any of a (11-22) plane, (–1-122) plane, (1-212) plane, (–12-12) plane, (–2112) plane, and (2-1-12) plane.

In this description, the term "{11-22} plane" means the growth surface of a single-crystal substrate which has a growth surface that lies within the range of directions deflected from the <11-22>-axis toward the M-axis by up to 15°, which are measured with an accuracy within ±0.01°. It is preferred that the "{11-22} plane" should be the growth surface which lies within the range of directions deflected by up to 10°. It is more preferred that the "{11-22} plane" should be the growth surface which lies within the range of directions deflected by up to 5°.

Furthermore, the "{11-22} plane" desirably is the growth surface of a single-crystal substrate which has a growth surface that lies within the range of directions deflected from the <11-22>-axis toward the C-axis by up to 25°, which are measured with an accuracy within ±0.01°. It is preferred that the "{11-22} plane" should be the growth surface which lies within the range of directions deflected by up to 10°. It is more preferred that the "(11-22) plane" should be the growth surface which lies within the range of directions deflected by up to 5°.

In this description, the term "{20-21} plane" is a plane which is equivalent to the {20-21} plane of a hexagonal structure (wurtzite crystal structure). The plane equivalent to the {20-21} plane is a semipolar plane.

Preferred examples of the plane equivalent to the {20-21} plane are a (20-21) plane, (2-201) plane, (02-21) plane, (0-221) plane, (–2201) plane, and (–2021) plane.

In this description, the term "{20-21} plane" means the growth surface of a single-crystal substrate which has a growth surface that lies within the range of directions deflected from the <20-21>-axis toward the A-axis by up to 15°, which are measured with an accuracy within ±0.01°. It is preferred that the "{20-21} plane" should be the growth surface which lies within the range of directions deflected by up to 10°. It is more preferred that the "{20-21} plane" should be the growth surface which lies within the range of directions deflected by up to 5°.

Furthermore, the term "{20-21} plane" means the growth surface of a single-crystal substrate which has a growth surface that lies within the range of directions deflected from the <20-21>-axis toward the C-axis by up to 25°, which are measured with an accuracy within ±0.01°. It is preferred that the "{20-21} plane" should be the growth surface which lies within the range of directions deflected by up to 10°. It is more preferred that the "{20-21} plane" should be the growth surface which lies within the range of directions deflected by up to 5°.

(Processes for Producing the Single-Crystal Substrates)

Processes for producing the single-crystal substrates to be used in the invention are not particularly limited, and the substrates can be produced by generally known processes.

Examples of methods for growing the crystal of each single-crystal substrate include a hydride vapor phase epitaxy (HVPE) method, metal-organic chemical vapor deposition (MOCVD) method, molecular beam epitaxy (MBE) method, sublimation method, sodium flux method, and solvothermal method.

Methods for processing the crystal of a single-crystal substrate are not limited so long as the amount of warpage of the resultant physical shape (Z1) is within the range according to the invention. A single-crystal substrate can be produced by a generally known method.

Figure 1:
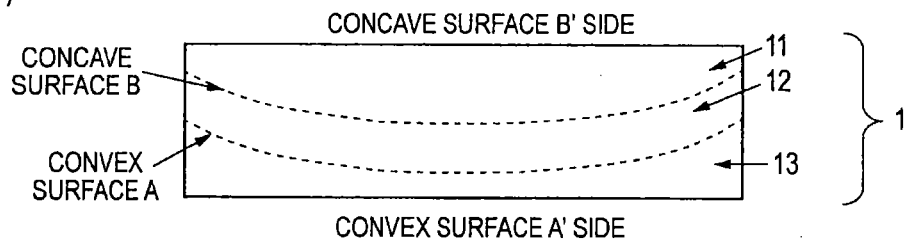
FIG. 1 (a) to (e) are diagrammatic views which illustrate one example of processes for producing a single-crystal substrate of the invention.
Figure 1:
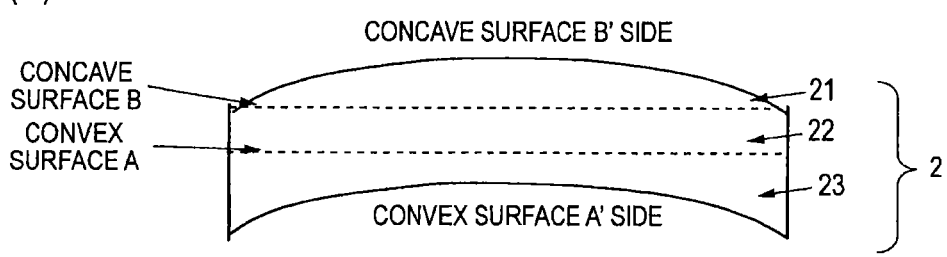
Figure 1:
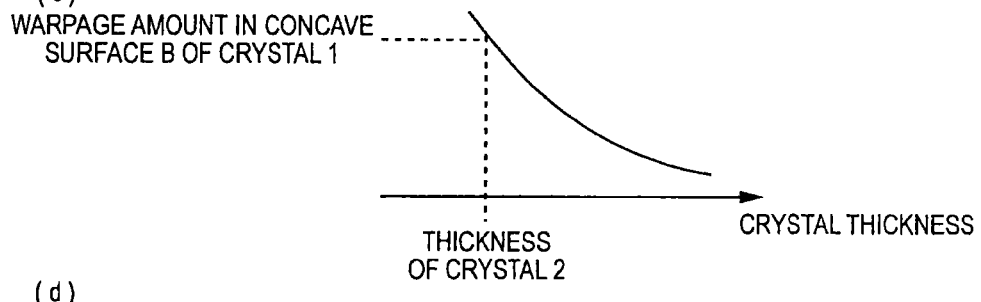
Figure 1:
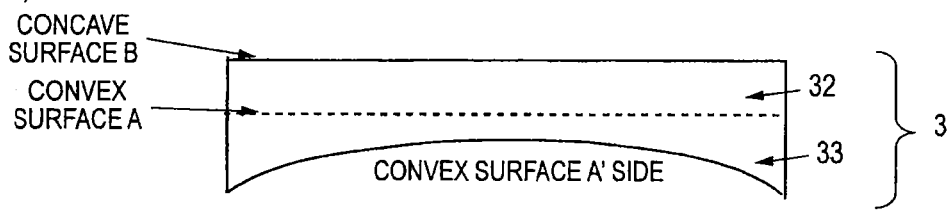
Figure 1:
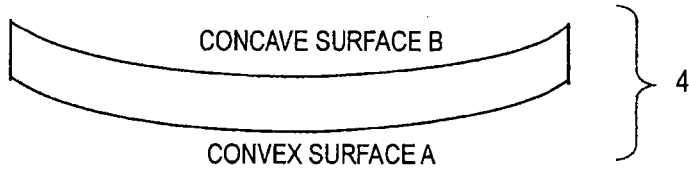

Specific examples thereof include a processing method in which a single-crystal substrate 4 (crystal 12) which has a convex surface A and a concave surface B is obtained from a crystal 1, as shown in FIG. 1 (*a*), by, for example, grinding, mechanical polishing, and chemical-mechanical polishing.

This method is explained below in detail as one example of methods for processing a single-crystal substrate. However, processing methods for producing the single-crystal substrates of the invention should not be construed as being limited to the following example.

First, the crystal 1 is subjected to a curving step for warping the crystal 1 so that the concave surface B becomes flat [FIG. 1 (*b*)].

In this curving step, methods for processing the crystal 1 are not particularly limited so long as the crystal 1 can be warped so that the concave surface B becomes flat. Examples thereof include a method in which a strain is utilized, a method in which a curved plate is utilized, and a method in which a compressive force is utilized.

The curving step in which a strain is utilized is a step in which a strain is applied to the surface B of the crystal, which has a surface A and a surface B that have the relation of front and back, to curve the surface B into a convex shape. For example, in the case of the crystal shown in FIG. 1 (b), the surface B can be curved by imposing a processing strain on the concave surface B' side.

The strain to be applied to the surface B and methods for strain formation are not particularly limited in the kinds thereof so long as the surface B comes to have a convex shape and the crystal as a whole is curved. Examples of methods for strain formation include grinding, polishing, and slicing. Specific examples thereof include a method in which the crystal is processed using a vitrified grindstone, free abrasive grains of diamond, or a wire having abrasive diamond grains fixed thereto.

It is preferred that when a strain is to be formed in the surface B, the crystal should be processed after having been applied to a plate so that the surface A side is in contact therewith. A strain may be formed in the surface B only, or may be formed in both the surface B and the surface A. When a strain is to be formed in the surface A, it is preferred to process the crystal after the crystal is applied to a plate so that the surface B side is in contact therewith. In the case where a strain is to be formed in both surfaces, the strain imposition on these surfaces may be conducted by the same or different means or methods.

The term "plate" in this description means a plate to which the crystal is applied in order to attach the crystal to an apparatus in preparation for grinding, polishing, or slicing. It is preferred that the plate surface to which the crystal is applied when a strain is to be formed should be flat from the standpoint of obtaining an even substrate thickness through grinding, polishing, or slicing. The crystal may be applied and fixed to the plate through a wax or the like or through a double-faced pressure-sensitive adhesive film.

In this description, the term "strain" means a strain which is generated by the microcracks or dislocations caused by the removal of a crystal surface layer with abrasive grains during grinding or polishing or by slicing. The tensile force which generates in the crystal surface as a result of the processing is called "strain force", which herein is distinguished from the "internal stress" which generates in an inner part of the crystal.

The microcracks or dislocations can be ascertained with a transmission electron microscope (TEM) or by a cathode luminescence (CL) method. A strain affects the amount of warpage of the substrate, and varies depending on the size of the abrasive grains used in the grinding or polishing, the rate of grinding, the pressure applied to the substrate, etc.

The magnitude of the strain, i.e., the tensile force generated in the crystal surface, can be estimated from the amount of warpage and the modulus of longitudinal elasticity of the crystal and from the shape of the substrate. In the case where the front and back surfaces of a substrate having a surface α and a surface β are compared in the magnitude of strain force, an estimation can be easily made from the direction of the warpage. When the substrate has been warped so that the surface α is convex, then the strain force of the surface a is considered to be higher than the strain force of the surface β.

The curving step in which a curved plate is utilized is a step in which the crystal, which has a surface A and a surface B that have the relation of front and back, is fixed to a surface of the curved plate so that the surface A is in contact with the curved plate, and the crystal is curved so that the surface B comes to have a convex shape.

The curved plate is a plate having a convex shape, and has a radius of curvature of preferably 1 m or more, more preferably 6.25-62.5 m. A preferred radius of curvature of the curved plate is determined according to the amount of warpage of the crystal which has not been fixed to the curved plate and the amount of warpage of a desired single-crystal substrate.

The term "curved plate" herein means a plate in which the surface for supporting the crystal has been curved into a convex shape. The term "radius of curvature of the curved plate" means the radius of curvature of the surface which has been curved in a convex shape and which comes into contact with the crystal. The material of the curved plate is not particularly limited in the kind thereof so long as the material does not deform during the processing. Specific examples thereof include ceramics and aluminum alloys.

The curving step in which a compressive force is utilized is a step in which a compressive force directed toward the center of the surface A of the crystal, which has a surface A and a surface B that have the relation of front and back, from the periphery of the surface A is applied to the surface A to curve the crystal so that the surface B comes to have a convex shape.

For example, a region which includes both the periphery of the surface A and the crystal side surface located near the periphery is pushed toward the crystal center axis which passes through the center of the surface A, or stress directed toward the center of the surface A is applied to a region which covers the surface A. Thus, a compressive force which is directed toward the center of the surface A from the periphery of the surface A can be applied.

Specific modes for the application of a compressive force are not particularly limited. Examples thereof include a mode in which either a wax applied to the region including both the periphery of the surface A and the crystal side surface located near the periphery or a wax applied to the region which covers the surface A is cooled and hardened and a compressive force is applied by means of the resultant contraction of the wax.

Whichever method for strain formation is used or whichever means for curving is employed, the concave surface B' side is curved into a convex shape, as shown in FIG. 1 (b), by the curving step described above and the concave surface B and the convex surface A become flat or substantially flat surfaces. Consequently, the amount of warpage resulting from the curving step considerably affects the amount of warpage of the single-crystal substrate to be finally produced.

In the case where the other production conditions are kept constant, the amount of warpage of the single-crystal substrate to be finally produced can be controlled by controlling the amount of warpage which results from the curving step. By determining a relationship between the two beforehand, the control is rendered easy.

For example, in the case of conducting the curving step in which a strain is utilized, there is a correlation between the amount of crystal warpage and crystal thickness. It is therefore preferred that the thickness of the crystal should be regulated when a specific warpage amount is desired. A correlation between the amount of crystal warpage and crystal thickness can be expressed, for example, by the graph given in FIG. 1 (c). Consequently, to grasp such a correlation beforehand makes it possible to attain any desired amount of crystal warpage.

Next, the crystal 2 is disposed so that the convex surface A side faces a plate. The crystal 2 is applied to the plate, while maintaining the warped shape of the crystal 2, to fix the crystal 2.

Subsequently, the concave surface B side of the crystal 2, which has a convex shape, is flattened to remove that region 21 of the crystal which lies between the concave surface B' and the concave surface B [FIG. 1 (*b*)] and thereby obtain a crystal 3 [FIG. 1 (*d*)]. The strain which has generated upon the flattening may be removed by chemical-mechanical polishing or may be removed by etching. Furthermore, the strain may be allowed to remain to such a degree that the residual strain poses no problem during the formation of a Group-III nitride crystal.

The crystal 3 subsequently is disposed so that the concave surface B faces a plate. It is preferred that the crystal 3 should be fixed while pressing the crystal 3 so that the concave surface B is flat.

Next, the convex surface A side of the crystal 3, which has a concave shape, is flattened to remove the crystal 33 [FIG. 1 (*d*)] and thereby obtain a single-crystal substrate 4 [FIG. 1 (*e*)]. The strain which has generated upon the flattening may be removed by chemical-mechanical polishing or may be removed by etching. Furthermore, the strain may be allowed to remain to such a degree that the residual strain poses no problem during the formation of a Group-III nitride crystal. The shape of the single-crystal substrate 4 is not limited to FIG. 1 (*e*), and there are cases where the concave surface B is convex when a strain remains.

(Process for Producing Group-III Nitride Crystal)

A Group-III nitride crystal is grown on a single-crystal substrate of the invention, and the single-crystal substrate is removed. Thus, a Group-III nitride crystal can be produced. This process preferably is a process for producing a Group-III nitride crystal in which gases for forming a Group-III nitride crystal are fed to over the single-crystal substrate of the invention to thereby grow the Group-III nitride crystal on the single-crystal substrate.

The kind of the Group-III nitride crystal to be grown is not particularly limited. Examples thereof include GaN, InN, AlN, InGaN, AlGaN, and AlInGaN. Preferred of these are GaN, AlN, and AlGaN. More preferred is GaN.

Examples of crystal growth methods which can be used in the process of the invention for producing a Group-III nitride crystal include vapor phase methods such as a hydride vapor phase epitaxy (HVPE) method, metal-organic chemical vapor deposition (MOCVD) method, molecular beam epitaxy (MBE) method, and sublimation method. Examples of usable liquid phase methods include a sodium flux method and a solvothermal method.

From the standpoint of obtaining high-purity crystals, preferred methods are an HVPE method, MOCVD method, sodium flux method, and solvothermal method, and an HVPE method is the most preferred.

Steps for growing a Group-III nitride crystal using a single-crystal substrate of the invention are explained next.

Details of apparatus to be used for the crystal growth are not particularly limited. For example, an HVPE apparatus such as that shown in FIG. 4 can be used.

Figure 4:
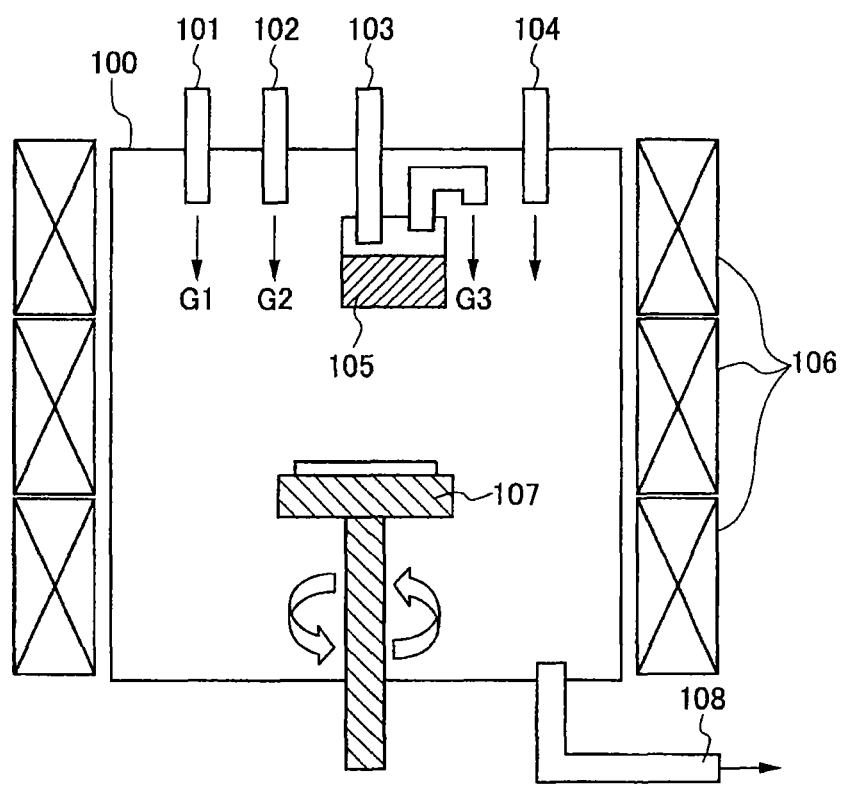
FIG. 4 is a diagrammatic sectional view of an HVPE apparatus used in the Examples and Comparative Examples.

The HVPE apparatus shown in FIG. 4 includes a reactor 100 and is equipped in the reactor 100 with a substrate holder (susceptor) 107 for mounting a base substrate thereon and a reservoir 105 for placing therein a starting material for the Group-III nitride crystal to be grown.

Furthermore, feed pipes 101 to 104 for introducing gasses into the reactor 100 and a gas discharge pipe 108 for gas discharge have been disposed. Moreover, a heater 106 for heating the reactor 100 from the lateral sides thereof has been disposed.

Examples of the material of the reactor 100 include quartz and polycrystalline boron nitride (BN) stainless steel. The material preferably is quartz.

Prior to initiation of the reaction, the space in the reactor 100 is filled beforehand with an ambient gas. Examples of the ambient gas include $H_2$ gas and inert gases such as $N_2$ gas, He, Ne, and Ar. These gases may be used as a mixture thereof.

The material of the substrate holder 107 preferably is carbon. More preferred is carbon in which the surface has been coated with SiC. The shape of the substrate holder 107 is not particularly limited so long as a base substrate of the invention can be disposed thereon. It is, however, preferred that the substrate holder should include no structure which during crystal growth is present on the upstream side of the crystals being grown.

In case where a structure on which crystal growth may occur is present on the upstream side, a polycrystalline object adheres to the structure to generate HCl gas as a product which accompanies the adhesion, and this HCl gas exerts an adverse influence on the crystals to be grown.

It is preferred that the single-crystal-substrate mounting surface of the substrate holder 107 should have a size which is smaller than the single-crystal substrate to be mounted. Namely, it is more preferred that the substrate holder 107 should have such a size that when the substrate holder 107 is viewed from the upstream side for gases, the substrate holder 107 is hidden by the size of the single-crystal substrate.

When a single-crystal substrate is mounted on the substrate holder 107, it is preferred that the single-crystal substrate should be mounted so that the growth surface thereof faces the upstream side with respect to the flow of gases (i.e., the upper part of the reactor in FIG. 4). Namely, it is preferred that the single-crystal substrate should be mounted so that gases flow toward the first crystal growth surface, and it is more preferred to mount the single-crystal substrate so that gases flow from the direction perpendicular to the first crystal growth surface. By mounting a single-crystal substrate in such a manner, a Group-III nitride crystal which is more even and has excellent crystallinity can be obtained.

A starting material serving as a Group-III element source is placed in the reservoir 105. Examples of the starting material serving as a Group-III element source include Ga, Al, and In.

Through the feed pipe 103, which is for introducing a gas into the reservoir 105, a gas that reacts with the starting material placed in the reservoir 105 is fed. For example, in the case where a starting material serving as a Group-III element source has been placed in the reservoir 105, HCl gas can be fed through the feed pipe 103.

In this operation, a carrier gas may be supplied through the feed pipe 103 together with the HCl gas. Examples of the carrier gas include $H_2$ gas and inert gases such as $N_2$ gas, He, Ne, and Ar.

These gases may be used as a mixture thereof. Although the carrier gas may be the same as or different from the ambient gas, it is preferred that the carrier gas should be the same as the ambient gas.

Through the feed pipe 101, a starting-material gas serving as a nitrogen source is fed. Usually, $NH_3$ gas is fed. Through the feed pipe 102, a carrier gas is supplied. Examples of this carrier gas include the same gases as the examples of the carrier gas to be supplied through the feed pipe 103.

It is preferred that the carrier gas to be supplied through the feed pipe 102 should be the same as the carrier gas to be supplied through the feed pipe 103. It is possible to feed a dopant gas through the feed pipe 102. For example, an n-type dopant gas, such as $SiH_4$, $SiH_2Cl_2$, etc., can be fed.

An etching gas can be supplied through the feed pipe 104. Examples of the etching gas include chlorine-based gases, and it is preferred to use HCl gas. Etching can be conducted by regulating the flow rate of the etching gas preferably to about 0.1-3% based on the total flow rate. A more preferred flow rate thereof is about 1% based on the total flow rate. The flow rates of gases can be regulated by means of a mass flow controller (MFC) or the like, and it is preferred that the flow rate of each gas should be always monitored with an MFC.

Those gases to be supplied through the feed pipes 101, 102, and 104 may be replaced with each other and supplied through different feed pipes. A starting-material gas serving as a V-Group element source and a carrier gas may be mixed together and fed through the same feed pipe. Furthermore, a carrier gas may be supplied through another feed pipe and mixed. These modes of feeding can be suitably determined according to the size and shape of the reactor 100, the reactivity of the starting materials, the desired rate of crystal growth, etc.

In general, the gas discharge pipe 108 is disposed so that gases can be discharged through the inner reactor wall located on the side opposite to the feed pipes 101 to 104 for gas introduction. In FIG. 4, the gas discharge pipe 108 has been disposed in the reactor bottom, which is located on the side opposite to the reactor top where the feed pipes 101 to 104 for gas introduction have been disposed.

In the case where the feed pipes for gas introduction have been disposed in the right-hand sidewall of the reactor, it is preferred that the gas discharge pipe should have been disposed in the left-hand sidewall of the reactor. By employing such a mode, a gas flow in a constant direction can be stably formed.

Crystal growth by an HVPE method is conducted usually preferably at 800-1,200° C., more preferably 900-1,100° C., even more preferably 925-1,070° C., especially preferably 950-1,050° C.

The internal pressure of the reactor is preferably 10-200 kPa, more preferably 30-150 kPa, even more preferably 50-120 kPa.

When etching is conducted, the temperature and pressure to be used for the etching may be the same as or different from the temperature and pressure used for the crystal growth.

There are cases where the Group-III nitride crystal obtained through the crystal growth has a polycrystalline object at the crystal plane boundary. The term "polycrystalline object" herein means crystals in which the atoms have failed to form the crystal lattice of, for example, a hexagonal system and are not present in the proper positions. Namely, that term means an aggregate of minute crystals having random crystal orientation, i.e., an aggregate of exceedingly small single-crystal grains.

In the case where the Group-III nitride crystal obtained through the crystal growth has the polycrystalline object, a step for removing the polycrystalline object is conducted and, thereafter, a step is further conducted in which a Group-III nitride crystal is grown on the surface of the crystal from which the polycrystalline object has been removed. In the case where the Group-III nitride crystal thus obtained still has a polycrystalline object at the crystal plane boundary, a step for removing the polycrystalline object is conducted again and a step for growing a Group-III nitride crystal on the surface is further conducted. By repeating this operation, a Group-III nitride crystal having no polycrystalline object can be obtained.

It is preferred that the crystal system of the Group-III nitride crystal obtained by the production process of the invention should be a hexagonal system. It is also preferred that the Group-III nitride crystal obtained should be a single crystal. It is preferred that the Group-III nitride crystal grown on the single-crystal substrate should have a thickness of 1 mm to 10 cm.

In the case where grinding, polishing, laser light irradiation, or the like is to be conducted after the crystal growth, the crystal is required to have some degree of size. Consequently, the thickness of the Group-III nitride crystal semiconductor grown on the single-crystal substrate is preferably 5 mm to 10 cm, more preferably 1-10 cm.

The Group-III nitride crystal obtained by the production process of the invention may be used as such, or may be used after having undergone processing such as grinding or slicing. The term "slicing" herein means (a) processing for making the quality of the surface C even in order to render the grown crystal usable as a base substrate or (b) processing for removing the initially grown part because this part has stress due to the dislocations present therein.

Specifically, the slicing can be conducted using an inner-blade type slicer, a wire saw slicer, etc. In the invention, it is preferred to conduct slicing and thereby produce crystals which have substantially the same shape and which have a lower dislocation density and few surface defects.

According to the production process of the invention, a Group-III nitride crystal having a surface C or surface M which has a surface roughness of 1 nm or less can be obtained. In particular, the production process of the invention is superior in that a Group-III nitride crystal having a surface C or surface M which has a surface roughness of 1 nm or less can be produced even when polishing is not conducted after the crystal growth.

Surface roughness (Rms) in the invention can be determined by calculating a root-mean-square value from data obtained by measuring the surface roughness of an area of 10 µm square with an atomic force microscope (AFM).

The Group-III nitride crystal produced by the production process of the invention can be used in various applications. In particular, the crystalline nitride is useful as the substrates of semiconductor devices such as, for example, light-emitting diodes which emit ultraviolet light or light of a blue, green, or another color, light-emitting devices which emit light having a relatively short wavelength, e.g., semiconductor lasers, and electronic devices.

Furthermore, the Group-III nitride crystal produced by the production process of the invention can be used also as a base substrate to obtain a Group-III nitride crystal having a larger size.

EXAMPLES

The features of the invention will be explained below in more detail by reference to Examples and Comparative Examples. The materials, use amounts, proportions, details of processing, processing procedures, etc. shown in the following Examples can be suitably modified unless the modifications depart from the spirit of the invention. Consequently, the scope of the invention should not be construed as being limited to the following embodiments.

In the following Examples and Comparative Examples, crystal growth was conducted using the HVPE apparatus shown in FIG. 4.

<Evaluation Methods>

(1) Amount of Warpage of Physical Shape (Z1)

The recess(es) and protrusion(s) of the whole surface of a single-crystal substrate were examined with an optical inspection apparatus (NIDEK Flatness Tester FT-17, manufactured by NIDEK Co., Ltd.), and the difference between the maximum value and minimum value of the surface level including the recess(es) and protrusion(s) was taken as the amount of warpage (Z1). The amount of warpage (Z1) was expressed by a positive number when the growth surface of the single-crystal substrate had a convex shape, and was expressed by a negative number when the growth surface had a concave shape.

(2) Amount of Warpage of Crystallographic-Plane Shape (Z2)

Sites located at distances of ±8 mm from the center of a single-crystal substrate were analyzed by X-ray diffractometry with X'Pert-MRD, manufactured by PANalytical B.V., to determine diffraction peak values for the (0002) plane, and the radius of curvature of the crystallographic-plane shape was calculated from the amount by which the diffraction peak values had shifted. The examination for determining diffraction peak values was made with respect to sites located at distances of ±8 mm from the center of the single-crystal substrate along each of the a-axis direction and the m-axis direction, and the radius of curvature herein was an average of the radius of curvature of the a-axis and the radius of curvature of the m-axis.

From the radius of curvature thus determined and from the relationship between the radius of curvature and the amount of warpage shown in FIG. 2, the value of ΔZ for the case where the examined area had been extended to the diameter of the single-crystal substrate, i.e., the amount of warpage of the crystallographic-plane shape (Z2), was determined. In a single-crystal substrate, the radius of curvature differs from region to region within the surface. However, a diameter of ±8 mm from the center was taken as an effective diameter, and the radius of curvature for this effective diameter was assumed to be evenly distributed throughout the surface.

Example 1

A self-supporting gallium nitride (GaN) substrate in which the front surface was constituted of a {0001} plane and which had a disk shape having a thickness of 400 μm and a diameter of 50 mm was prepared as a single-crystal substrate. This single-crystal substrate had an amount of warpage of the physical shape (Z1) of 6 μm and an amount of warpage of the crystallographic-plane shape (Z2) of −103 μm.

The self-supporting GaN substrate was placed on the substrate holder made of SiC-coated carbon and having a diameter of 70 mm and a thickness of 20 mm (FIG. 4), and the substrate holder was disposed in the reactor 100 of the HVPE apparatus as shown in FIG. 4.

The internal temperature of the reactor was elevated to 1,025° C. Thereafter, an $H_2$ carrier gas G1, an $N_2$ carrier gas G2, GaCl gas G3 which was a product of reaction between Ga and HCl, and $NH_3$ gas G4 were continuously supplied respectively through the feed pipes 101 to 104 to grow a GaN layer for 23.5 hours.

In the step of growing a GaN layer, the growth pressure was regulated to $1.01 \times 10^5$ Pa, the partial pressure of the GaCl gas G3 was regulated to $7.39 \times 10^2$ Pa, and the partial pressure of the $NH_3$ gas G4 was regulated to $7.05 \times 10^3$ Pa. After completion of the GaN layer growth step, the internal temperature of the reactor was lowered to room temperature to obtain a thick film of single-crystal GaN as a Group-III nitride crystal. The thick film of single-crystal GaN obtained had a thickness, as measured with a stylus type thickness meter, of 3.0 mm, and no cracks were observed therein in a visual examination.

Example 2

A self-supporting gallium nitride (GaN) substrate in which the front surface was constituted of a {0001} plane and which had a disk shape having a thickness of 400 μm and a diameter of 54 mm was prepared as a single-crystal substrate. This single-crystal substrate had a value of Z1 of 7 μm and a value of Z2 of −93 μm.

Using the self-supporting GaN substrate, a thick film of single-crystal GaN was obtained as a Group-III nitride crystal in the same manner as in Example 1, except that the internal temperature of the reactor was changed to 1,020° C. and the period of GaN layer growth was changed to 20 hours. The thick film of single-crystal GaN obtained had a thickness, as measured with a stylus type thickness meter, of 2.7 mm, and no cracks were observed therein.

Example 3

A self-supporting gallium nitride (GaN) substrate in which the front surface was constituted of a {0001} plane and which had a disk shape having a thickness of 400 μm and a diameter of 54 mm was prepared as a single-crystal substrate. This single-crystal substrate had a value of Z1 of 10 μm and a value of Z2 of −106 μm.

Using the self-supporting GaN substrate, a thick film of single-crystal GaN was obtained as a Group-III nitride crystal in the same manner as in Example 1, except that the internal temperature of the reactor was changed to 1,020° C. and the period of GaN layer growth was changed to 20 hours. The thick film of single-crystal GaN obtained had a thickness, as measured with a stylus type thickness meter, of 2.4 mm, and no cracks were observed therein in a visual examination.

Example 4

A self-supporting gallium nitride (GaN) substrate in which the front surface was constituted of a {0001} plane and which had a disk shape having a thickness of 400 pun and a diameter of 50 mm was prepared as a single-crystal substrate. This single-crystal substrate had a value of Z1 of 13 μm and a value of Z2 of −55 μm.

Using the self-supporting GaN substrate, a thick film of single-crystal GaN was obtained as a Group-III nitride crystal in the same manner as in Example 1. The thick film of single-crystal GaN obtained had a thickness, as measured with a stylus type thickness meter, of about 3.0 mm, and no cracks were observed therein in a visual examination.

Example 5

A self-supporting gallium nitride (GaN) substrate in which the front surface was constituted of a {0001} plane and which had a disk shape having a thickness of 400 μm and a diameter of 50 mm was prepared as a single-crystal substrate. This single-crystal substrate had a value of Z1 of 13 μm and a value of Z2 of −82 μm.

Using the self-supporting GaN substrate, a thick film of single-crystal GaN was obtained as a Group-III nitride crystal in the same manner as in Example 1. The thick film of single-crystal GaN obtained had a thickness, as measured with a stylus type thickness meter, of about 3.2 mm, and no cracks were observed therein in a visual examination.

Example 6

A self-supporting gallium nitride (GaN) substrate in which the front surface was constituted of a {0001} plane and which had a disk shape having a thickness of 398 μm and a diameter of 54 mm was prepared as a single-crystal substrate. This single-crystal substrate had a value of Z1 of 15 μm and a value of Z2 of −91 μm.

Using the self-supporting GaN substrate, a thick film of single-crystal GaN was obtained as a Group-III nitride crystal in the same manner as in Example 1, except that the internal temperature of the reactor was changed to 1,020° C. and the period of GaN layer growth was changed to 20 hours. The thick film of single-crystal GaN obtained had a thickness, as measured with a stylus type thickness meter, of 2.4 mm, and no cracks were observed therein in a visual examination.

Example 7

A self-supporting gallium nitride (GaN) substrate in which the front surface was constituted of a {0001} plane and which had a disk shape having a thickness of 662 pin and a diameter of 54 mm was prepared as a single-crystal substrate. This single-crystal substrate had a value of Z1 of 20 μm and a value of Z2 of −131 μm.

Using the self-supporting GaN substrate, a thick film of single-crystal GaN was obtained as a Group-III nitride crystal in the same manner as in Example 1, except that the internal temperature of the reactor was changed to 1,020° C. and the period of GaN layer growth was changed to 24 hours. The thick film of single-crystal GaN obtained had a thickness, as measured with a stylus type thickness meter, of 2.9 mm, and no cracks were observed therein in a visual examination.

Example 8

A self-supporting gallium nitride (GaN) substrate in which the front surface was constituted of a {0001} plane and which had a disk shape having a thickness of 484 μm and a diameter of 53 mm was prepared as a single-crystal substrate. This single-crystal substrate had a value of Z1 of 21 μm and a value of Z2 of −91 μm.

Using the self-supporting GaN substrate, a thick film of single-crystal GaN was obtained as a Group-III nitride crystal in the same manner as in Example 1, except that the internal temperature of the reactor was changed to 1,020° C. and the period of GaN layer growth was changed to 20 hours. The thick film of single-crystal GaN obtained had a thickness, as measured with a stylus type thickness meter, of 2.7 mm, and no cracks were observed therein in a visual examination.

Example 9

A self-supporting gallium nitride (GaN) substrate in which the front surface was constituted of a {0001} plane and which had a disk shape having a thickness of 399 μm and a diameter of 54 mm was prepared as a single-crystal substrate. This single-crystal substrate had a value of Z1 of 26 μm and a value of Z2 of −110 μm.

Using the self-supporting GaN substrate, a thick film of single-crystal GaN was obtained as a Group-III nitride crystal in the same manner as in Example 1, except that the internal temperature of the reactor was changed to 1,020° C. and the period of GaN layer growth was changed to 20 hours. The thick film of single-crystal GaN obtained had a thickness, as measured with a stylus type thickness meter, of 2.4 mm, and no cracks were observed therein in a visual examination.

Example 10

A self-supporting gallium nitride (GaN) substrate in which the front surface was constituted of a {0001} plane and which had a disk shape having a thickness of 400 μm and a diameter of 47 mm was prepared as a single-crystal substrate. This single-crystal substrate had a value of Z1 of 12 μm and a value of Z2 of −66 μm.

Using the self-supporting GaN substrate, a thick film of single-crystal GaN was obtained as a Group-III nitride crystal in the same manner as in Example 1, except that the internal temperature of the reactor was changed to 1,020° C. and the period of GaN layer growth was changed to 20 hours. The thick film of single-crystal GaN obtained had a thickness, as measured with a stylus type thickness meter, of 3.5 mm, and no cracks were observed therein in a visual examination.

Example 11

A self-supporting gallium nitride (GaN) substrate in which the front surface was constituted of a {0001} plane and which had a disk shape having a thickness of 390 μm and a diameter of 54 mm was prepared as a single-crystal substrate. This single-crystal substrate had a value of Z1 of 17 μm and a value of Z2 of −79 μm.

Using the self-supporting GaN substrate, a thick film of single-crystal GaN was obtained as a Group-III nitride crystal in the same manner as in Example 1, except that the internal temperature of the reactor was changed to 1,020° C. and the period of GaN layer growth was changed to 20 hours. The thick film of single-crystal GaN obtained had a thickness, as measured with a stylus type thickness meter, of 2.4 mm, and no cracks were observed therein in a visual examination.

Example 12

A self-supporting gallium nitride (GaN) substrate in which the front surface was constituted of a {0001} plane and which had a disk shape having a thickness of 400 μm and a diameter of 50 mm was prepared as a single-crystal substrate. This single-crystal substrate had a value of Z1 of 22 μm and a value of Z2 of −134 μm.

Using the self-supporting GaN substrate, a thick film of single-crystal GaN was obtained as a Group-III nitride crystal in the same manner as in Example 1. The thick film of single-crystal GaN obtained had a thickness, as measured with a stylus type thickness meter, of about 3.0 mm, and no cracks were observed therein in a visual examination.

Example 13

A self-supporting gallium nitride (GaN) substrate in which the front surface was constituted of a {0001} plane and which had a disk shape having a thickness of 400 μm and a diameter of 54 mm was prepared as a single-crystal substrate. This single-crystal substrate had a value of Z1 of 23 μm and a value of Z2 of −94 μm.

Using the self-supporting GaN substrate, a thick film of single-crystal GaN was obtained as a Group-III nitride crystal in the same manner as in Example 1, except that the internal temperature of the reactor was changed to 1,020° C. and the period of GaN layer growth was changed to 20 hours. The thick film of single-crystal GaN obtained had a thickness, as measured with a stylus type thickness meter, of about 2.3 mm, and no cracks were observed therein in a visual examination.

Example 14

A self-supporting gallium nitride (GaN) substrate in which the front surface was constituted of a {0001} plane and which had a disk shape having a thickness of 400 μm and a diameter of 54 mm was prepared as a single-crystal substrate. This single-crystal substrate had a value of Z1 of 27 μm and a value of Z2 of −92 μm.

Using the self-supporting GaN substrate, a thick film of single-crystal GaN was obtained as a Group-III nitride crystal in the same manner as in Example 1, except that the internal temperature of the reactor was changed to 1,020° C. and the period of GaN layer growth was changed to 20 hours. The thick film of single-crystal GaN obtained had a thickness, as measured with a stylus type thickness meter, of about 2.4 mm, and no cracks were observed therein in a visual examination.

Example 15

A self-supporting gallium nitride (GaN) substrate in which the front surface was constituted of a {0001} plane and which had a disk shape having a thickness of 399 μm and a diameter of 54 mm was prepared as a single-crystal substrate. This single-crystal substrate had a value of Z1 of 27 μm and a value of Z2 of −67 μm.

Using the self-supporting GaN substrate, a thick film of single-crystal GaN was obtained as a Group-III nitride crystal in the same manner as in Example 1, except that the internal temperature of the reactor was changed to 1,020° C. and the period of GaN layer growth was changed to 20 hours. The thick film of single-crystal GaN obtained had a thickness, as measured with a stylus type thickness meter, of about 2.7 mm, and no cracks were observed therein in a visual examination.

Comparative Example 1

A self-supporting gallium nitride (GaN) substrate in which the front surface was constituted of a {0001} plane and which had a disk shape having a thickness of 404 μm and a diameter of 54 mm was prepared as a single-crystal substrate. This single-crystal substrate had a value of Z1 of −13 μm and a value of Z2 of −117 μm.

Using the self-supporting GaN substrate, a thick film of single-crystal GaN was obtained as a Group-III nitride crystal in the same manner as in Example 2. The thick film of single-crystal GaN obtained had a thickness, as measured with a stylus type thickness meter, of 2.7 mm, and cracks were observed therein in a visual examination.

Comparative Example 2

A self-supporting gallium nitride (GaN) substrate in which the front surface was constituted of a {0001} plane and which had a disk shape having a thickness of 400 μm and a diameter of 50 mm was prepared as a single-crystal substrate. This single-crystal substrate had a value of Z1 of −40 μm and a value of Z2 of −129 μm.

Using the self-supporting GaN substrate, a thick film of single-crystal GaN was obtained as a Group-III nitride crystal in the same manner as in Example 1. The thick film of single-crystal GaN obtained had a thickness, as measured with a stylus type thickness meter, of 3.3 mm, and cracks were observed therein in a visual examination.

Comparative Example 3

A self-supporting gallium nitride (GaN) substrate in which the front surface was constituted of a {0001} plane and which had a disk shape having a thickness of 666 μm and a diameter of 53 mm was prepared as a single-crystal substrate. This single-crystal substrate had a value of Z1 of −42 μm and a value of Z2 of −164 μm.

Using the self-supporting GaN substrate, a thick film of single-crystal GaN was obtained as a Group-III nitride crystal in the same manner as in Example 7. The thick film of single-crystal GaN obtained had a thickness, as measured with a stylus type thickness meter, of 3.7 mm, and cracks were observed therein in a visual examination.

Comparative Example 4

A self-supporting gallium nitride (GaN) substrate in which the front surface was constituted of a {0001} plane and which had a disk shape having a thickness of 390 μm and a diameter of 54 mm was prepared as a single-crystal substrate. This single-crystal substrate had a value of Z1 of −15 μm and a value of Z2 of −130 μm.

Using the self-supporting GaN substrate, a thick film of single-crystal GaN was obtained as a Group-III nitride crystal in the same manner as in Example 2. The thick film of single-crystal GaN obtained had a thickness, as measured with a stylus type thickness meter, of 2.5 mm, and cracks were observed therein in a visual examination.

Comparative Example 5

A self-supporting gallium nitride (GaN) substrate in which the front surface was constituted of a {0001} plane and which had a disk shape having a thickness of 403 μm and a diameter of 54 mm was prepared as a single-crystal substrate. This single-crystal substrate had a value of Z1 of −9 μm and a value of Z2 of −127 μm.

Using the self-supporting GaN substrate, a thick film of single-crystal GaN was obtained as a Group-III nitride crystal in the same manner as in Example 2. The thick film of single-crystal GaN obtained had a thickness, as measured with a stylus type thickness meter, of 2.8 mm, and cracks were observed therein in a visual examination.

The results are shown in Table 1 and Table 2.

TABLE 1

| | | Example 1 | Example 2 | Example 3 | Example 4 | Example 5 | Example 6 |
|---|---|---|---|---|---|---|---|
| Single-crystal substrate | Material | GaN | GaN | GaN | GaN | GaN | GaN |
| | Diameter (mm) | 50 | 54 | 54 | 50 | 50 | 54 |
| | Thickness (μm) | 400 | 400 | 400 | 400 | 400 | 398 |
| | Physical shape | convex | convex | convex | convex | convex | convex |
| | Amount of warpage (Z1) (μm) | 6 | 7 | 10 | 13 | 13 | 15 |
| | Crystallographic plane of growth surface | (0001) | (0001) | (0001) | (0001) | (0001) | (0001) |
| | Crystallograpic-plane shape | concave | concave | concave | concave | concave | concave |
| | Radius of curvature of crystallographic-plane shape (m) | 3.0 | 3.9 | 3.5 | 5.7 | 3.8 | 4.0 |
| | Amount of warpage (Z2) (μm) | −103 | −93 | −106 | −55 | −82 | −91 |
| | Z2/Z1 | −19 | −13 | −10 | −4 | −6 | −6 |
| Growth conditions for Group-III nitride crystal | Growth temperature (° C.) | 1025 | 1020 | 1020 | 1025 | 1025 | 1020 |
| | Growth period (h) | 23.5 | 20 | 20 | 23.5 | 23.5 | 20 |
| | Grown-film thickness (mm) | 3.0 | 2.7 | 2.4 | 3.0 | 3.2 | 2.4 |
| Results of evaluation of Group-III nitride crystal | Crack | not observed | not observed | not observed | not observed | not observed | not observed |

| | | Example 7 | Example 8 | Example 9 | Example 10 |
|---|---|---|---|---|---|
| Single-crystal substrate | Material | GaN | GaN | GaN | GaN |
| | Diameter (mm) | 53 | 53 | 54 | 47 |
| | Thickness (μm) | 662 | 484 | 399 | 400 |
| | Physical shape | convex | convex | convex | convex |
| | Amount of warpage (Z1) (μm) | 20 | 21 | 26 | 12 |
| | Crystallographic plane of growth surface | (0001) | (0001) | (0001) | (0001) |
| | Crystallograpic-plane shape | concave | concave | concave | concave |
| | Radius of curvature of crystallographic-plane shape (m) | 2.7 | 3.9 | 3.3 | 4.2 |
| | Amount of warpage (Z2) (μm) | −131 | −91 | −110 | −66 |
| | Z2/Z1 | −7 | −4 | −4 | −6 |
| Growth conditions for Group-III nitride crystal | Growth temperature (° C.) | 1020 | 1020 | 1020 | 1020 |
| | Growth period (h) | 24 | 20 | 20 | 20 |
| | Grown-film thickness (mm) | 2.9 | 2.7 | 2.4 | 3.5 |
| Results of evaluation of Group-III nitride crystal | Crack | not observed | not observed | not observed | not observed |

TABLE 2

| | | Example 11 | Example 12 | Example 13 | Example 14 | Example 15 | Comparative Example 1 |
|---|---|---|---|---|---|---|---|
| Single-crystal substrate | Material | GaN | GaN | GaN | GaN | GaN | GaN |
| | Diameter (mm) | 54 | 50 | 54 | 54 | 54 | 54 |
| | Thickness (μm) | 390 | 400 | 400 | 400 | 399 | 404 |
| | Physical shape | convex | convex | convex | convex | convex | concave |
| | Amount of warpage (Z1) (μm) | 17 | 22 | 23 | 27 | 27 | −13 |
| | Crystallographic plane of growth surface | (0001) | (0001) | (0001) | (0001) | (0001) | (0001) |

TABLE 2-continued

|  |  |  |  |  |  |  |  |
|---|---|---|---|---|---|---|---|
|  | Crystallographic-plane shape | concave | concave | concave | concave | concave | concave |
|  | Radius of curvature of crystallographic-plane shape (m) | 4.6 | 2.3 | 3.9 | 4.0 | 5.4 | 3.1 |
|  | Amount of warpage (Z2) (μm) | −79 | −134 | −94 | −92 | −67 | −117 |
|  | Z2/Z1 | −5 | −6 | −4 | −3 | −2 | 9 |
| Growth conditions for Group-III nitride crystal | Growth temperature (° C.) | 1020 | 1025 | 1020 | 1020 | 1020 | 1020 |
|  | Growth period (h) | 20 | 23.5 | 20 | 20 | 20 | 20 |
|  | Grown-film thickness (mm) | 2.4 | 3.0 | 2.3 | 2.4 | 2.7 | 2.7 |
| Results of evaluation of Group-III nitride crystal | Crack | not observed | not observed | not observed | not observed | not observed | observed |

|  |  | Comparative Example 2 | Comparative Example 3 | Comparative Example 4 | Comparative Example 5 |
|---|---|---|---|---|---|
| Single-crystal substrate | Material | GaN | GaN | GaN | GaN |
|  | Diameter (mm) | 50 | 53 | 54 | 54 |
|  | Thickness (μm) | 400 | 666 | 390 | 403 |
|  | Physical shape | concave | concave | concave | concave |
|  | Amount of warpage (Z1) (μm) | −40 | −42 | −15 | −9 |
|  | Crystallographic plane of growth surface | (0001) | (0001) | (0001) | (0001) |
|  | Crystallographic-plane shape | concave | concave | concave | concave |
|  | Radius of curvature of crystallographic-plane shape (m) | 2.4 | 2.1 | 2.8 | 2.9 |
|  | Amount of warpage (Z2) (μm) | −129 | −164 | −130 | −127 |
|  | Z2/Z1 | 3 | 4 | 9 | 15 |
| Growth conditions for Group-III nitride crystal | Growth temperature (° C.) | 1025 | 1020 | 1020 | 1020 |
|  | Growth period (h) | 23.5 | 24 | 20 | 20 |
|  | Grown-film thickness (mm) | 3.3 | 3.7 | 2.5 | 2.8 |
| Results of evaluation of Group-III nitride crystal | Crack | observed | observed | observed | observed |

As shown in Table 1 and Table 2, no cracks generated in Examples 1 to 15, and thick films of single-crystal GaN of satisfactory quality were obtained in the Examples.

On the other hand, in Comparative Examples 1 to 5, the crystals had cracks, which were presumed to have generated in the initial stage of growth, and the cracks remained open after the growth to a thick film, as shown in Table 2. As a result, the only single crystals which were able to be obtained in the Comparative Examples were single-crystal GaN having a small crack-free region.

While the invention has been described in detail and with reference to specific embodiments thereof, it will be apparent to one skilled in the art that various changes and modifications can be made therein without departing from the spirit and scope thereof. This application is based on a Japanese patent application filed on Jan. 15, 2010 (Application No. 2010-007307), the entire contents thereof being incorporated herein by reference.

INDUSTRIAL APPLICABILITY

When the single-crystal substrates of the invention are used for growing a Group-III nitride crystal, crack generation can be inhibited and, hence, a Group-III nitride crystal having a large thickness can be obtained. Consequently, a Group-III element nitride semiconductor substrate having a large area can be produced.

Furthermore, by selecting the single-crystal substrates of the invention, whether a Group-III nitride crystal obtained using the single-crystal substrates has a crack or not can be determined in the stage of substrate inspection conducted before the step of growing the Group-III nitride crystal into a thick film. As a result, the yield of the Group-III nitride crystal is improved, and the Group-III nitride crystal which is flat and has an even thickness can be produced at low cost.

Moreover, in the case where the single-crystal substrates of the invention are used for producing a light-emitting semiconductor element or a semiconductor device, it is possible to obtain a high-quality light-emitting semiconductor element or semiconductor device in satisfactory yield because a Group-III nitride crystal which is flat and even can be obtained.

The Group-III nitride crystal obtained is useful as the substrates of semiconductor devices such as, for example, light-emitting semiconductor devices, e.g., light-emitting diodes and semiconductor lasers, and electronic devices. Consequently, the invention has high industrial applicability.

DESCRIPTION OF THE REFERENCE NUMERALS AND SIGNS 1-3 Crystal
4 Single-crystal substrate
11, 21 Region lying between concave surface B' and concave surface B in crystal
12, 22, 32 Region lying between concave surface B and convex surface A in crystal
13, 23, 33 Region lying between convex surface A and convex surface A' in crystal
100 Reactor
101-104 Feed pipe
105 Reservoir
106 Heater
107 Substrate holder
108 Gas discharge pipe
G1 Starting-material gas serving as nitrogen source
G2 Carrier gas
G3 Group-III element source gas

The invention claimed is:

1. A method for producing a light-emitting semiconductor element or a semiconductor device, which comprises growing a Group-III nitride crystal on a growth surface of a single-crystal substrate, wherein the single-crystal substrate satisfies the following expressions (1) and (2) and has a back surface of concave shape, wherein Z1 (μm) is an amount of warpage of physical shape in a growth surface of the single-crystal substrate and Z2 (μm) is an amount of warpage calculated from a radius of curvature of crystallographic-plane shape in a growth surface of the single crystal substrate:

$$Z1>0 \qquad \text{Expression (1)}$$

$$Z2<0 \qquad \text{Expression (2).}$$

2. The method according to claim 1, wherein the single-crystal substrate is a hexagonal crystal, and a crystallographic plane of the growth surface thereof is any one of a {0001} plane, a {10-10} plane, a {11-20} plane, a {11-22} plane, and a {20-21} plane.

3. The method according to claim 1, wherein the single-crystal substrate comprises a Group-III nitride crystal.

4. The method according to claim 1, wherein the single-crystal substrate has an area of 20 cm² or more.

5. The method according to claim 1, wherein a thickness of the single-crystal substrate is 100 μm to 1,000 μm.

6. The method according to claim 1, wherein the growth surface is a polished surface.

7. The method according to claim 1, wherein in the step of growing a Group-III nitride crystal, the Group-III nitride crystal is vapor-phase grown.

8. The method according to claim 7, wherein a method of vapor-phase growth is at least one method selected from the group consisting of an HVPE method, a MOCVD method, a MBE method or a sublimation method.

9. A method for producing a Group-III nitride crystal, which comprises growing a Group-III nitride crystal on a growth surface of a single-crystal substrate, wherein the single-crystal substrate satisfies the following expressions (1) and (2) and has a back surface of concave shape, wherein Z1 (μm) is an amount of warpage of physical shape in a growth surface of the single-crystal substrate and Z2 (μm) is an amount of warpage calculated from a radius of curvature of crystallographic-plane shape in a growth surface of the single crystal substrate:

$$Z1>0 \qquad \text{Expression (1)}$$

$$Z2<0 \qquad \text{Expression (2).}$$

10. The method according to claim 9, wherein the single-crystal substrate is a hexagonal crystal, and a crystallographic plane of the growth surface thereof is any one of a {0001} plane, a {10-10} plane, a {11-20} plane, a {11-22} plane, and a {20-21} plane.

11. The method according to claim 9, wherein the single-crystal substrate comprises a Group-III nitride crystal.

12. The method according to claim 9, wherein the single-crystal substrate has an area of 20 cm² or more.

13. The method according to claim 9, wherein a thickness of the single-crystal substrate is 100 μm to 1,000 μm.

14. The method according to claim 9, wherein the growth surface is a polished surface.

15. The method according to claim 9, wherein in the step of growing a Group-III nitride crystal, the Group-III nitride crystal is vapor-phase grown.

16. The method according to claim 15, wherein a method of vapor-phase growth is at least one method selected from the group consisting of an HVPE method, a MOCVD method, a MBE method or a sublimation method.

17. The method according to claim 9, which, after the step of growing the Group-III nitride crystal, further comprises removing the single-crystal substrate from the grown Group-III nitride crystal.

18. The method according to claim 9, wherein the Group-III nitride crystal to be grown in the step of growing is a GaN crystal.

* * * * *